United States Patent
Yoshida et al.

(10) Patent No.: US 8,493,765 B2
(45) Date of Patent: Jul. 23, 2013

(54) SEMICONDUCTOR DEVICE AND ELECTRONIC DEVICE

(75) Inventors: Takayuki Yoshida, Shiga (JP); Mitsumi Itou, Kyoto (JP); Shinya Tokunaga, Kanagawa (JP)

(73) Assignee: Panasonic Corporation, Osaka (JP)

( * ) Notice: Subject to any disclaimer, the term of this patent is extended or adjusted under 35 U.S.C. 154(b) by 5 days.

(21) Appl. No.: 13/365,358

(22) Filed: Feb. 3, 2012

(65) Prior Publication Data

US 2012/0127774 A1    May 24, 2012

Related U.S. Application Data

(63) Continuation of application No. PCT/JP2010/001241, filed on Feb. 24, 2010.

(30) Foreign Application Priority Data

Aug. 7, 2009 (JP) .................................. 2009-184381

(51) Int. Cl.
    *G11C 5/06* (2006.01)
(52) U.S. Cl.
    USPC .................................. 365/63; 365/51; 365/52
(58) Field of Classification Search
    USPC ........ 365/63, 51, 52, 191; 257/777, 773–774, 257/E23.141
    See application file for complete search history.

(56) References Cited

U.S. PATENT DOCUMENTS

| 6,303,998 | B1 | 10/2001 | Murayama |
| 7,957,173 | B2 * | 6/2011 | Kim ................................. 365/51 |
| 2004/0012086 | A1 | 1/2004 | Infantolino et al. |
| 2004/0155339 | A1 | 8/2004 | Infantolino et al. |
| 2010/0252936 | A1 | 10/2010 | Imaoka et al. |

FOREIGN PATENT DOCUMENTS

| JP | 1-81328 | 3/1989 |
| JP | 11-186326 | 7/1999 |
| JP | 2004-56127 | 2/2004 |
| JP | 2006-49586 | 2/2006 |
| WO | 2008/149508 | 12/2008 |

OTHER PUBLICATIONS

International Search Report of PCT Application No. PCT/JP2010/001241, dated Apr. 6, 2010.

* cited by examiner

*Primary Examiner* — David Lam
(74) *Attorney, Agent, or Firm* — McDermott Will & Emery LLP

(57) ABSTRACT

All interface pins for transmitting and receiving a signal having a predetermined function of a semiconductor integrated circuit element are formed on an outer periphery of the semiconductor integrated circuit element along one side of the semiconductor integrated circuit element. The one side of the semiconductor integrated circuit element is adjacent to two of sides of a BGA substrate, the two sides being not parallel to the one side. Of balls provided on the BGA substrate, balls electrically connected to the interface pins for transmitting and receiving a signal having a predetermined function are provided between the one side of the semiconductor integrated circuit element and the two sides of the BGA substrate.

6 Claims, 5 Drawing Sheets

SEMICONDUCTOR DEVICE AND ELECTRONIC DEVICE

CROSS-REFERENCE TO RELATED APPLICATIONS

This is a continuation of PCT International Application PCT/JP2010/001241 filed on Feb. 24, 2010, which claims priority to Japanese Patent Application No. 2009-184381 filed on Aug. 7, 2009. The disclosures of these applications including the specifications, the drawings, and the claims are hereby incorporated by reference in their entirety.

BACKGROUND

The present disclosure relates to semiconductor devices and electronic devices, and more particularly, to semiconductor devices including a semiconductor integrated circuit element and a BGA substrate on which the semiconductor integrated circuit element is mounted, and electronic devices including the semiconductor devices.

In order to reduce the size and cost of an electronic apparatus which processes high-speed and high-resolution moving images, such as a high-definition digital television, all functions may be integrated into a single semiconductor chip. Therefore, microfabrication technology has been advanced for wafer processing of semiconductor elements, leading to a reduction in chip area. It is, however, necessary to enable a so-called system LSI (system on a chip) to process images in a high-definition digital television while transmitting and receiving a large amount of data to and from a peripheral memory element. In this case, the data transfer rate between the memory element and the system LSI is typically becoming 1.3 Gbps or more.

Examples of a mainstream packaging for a system LSI are a plastic ball grid array (P-BGA) package, which employs wire bonding, and a flip chip BGA (FCBGA) package, which employs solder bumps etc. These packages are capable of providing a large number of input and output signal lines and supplying large or various powers.

There is also a demand for a smaller semiconductor device incorporated in an electronic apparatus in order to reduce the area of the semiconductor device mounted on an interconnect substrate. In an effort to meet these requirements, for example, a system-in-a-package (hereinafter referred as an "SiP"), which is a plurality of semiconductor chips enclosed in a single package, has been employed.

High-speed multi-bit data transfer between a plurality of memories may be achieved in a semiconductor device as follows. Semiconductor chips are connected together using short interconnects to reduce a signal delay time, thereby reducing a degradation in the performance of the mounted semiconductor chips and an increase in the areas of the chips mounted on the substrate in the semiconductor device. Specifically, there is a proposed semiconductor device (a system-in-a-package or a multi-chip package) in which each memory element is provided with a plurality of chip interconnect pads for interfacing with signal interconnects input and output in common between the memory elements, and a plurality of pads for receiving signals (e.g., a data signal, an address signal, a control signal, etc.) required for operation of the memory element are arbitrarily connected to the chip interconnect pads via interconnects in each memory element. In the semiconductor device, by connecting the memory elements in series using these pads and external interconnects, the length of the interconnect between each semiconductor chip can be reduced, whereby the signal delay time can be reduced, and therefore, a degradation in the performance of the mounted semiconductor chips and an increase in the area of the chips mounted on the semiconductor device can be reduced (see, for example, Japanese Patent Publication No. 2006-49586).

SUMMARY

However, there is a problem with the structure of Japanese Patent Publication No. 2006-49586 that a dedicated memory element for transmitting a signal is required in the memory device and cannot be replaced with a general-purpose memory element. Also, the memory elements are arranged in a straight line, and therefore, for some interconnect lengths, a data bus can perform "on-device termination (ODT)" in a high-speed transmission memory. However, in some cases, an address bus may require a terminating resistor, so that an extra interconnection region may disadvantageously be required.

When two memory elements are used, then if, for example, high-speed data transmission interface terminals (hereinafter referred to as IO terminals) are arranged in an L-shape at a corner portion of the system LSI, the area of the memory elements mounted on the PCB is preferably reduced. In this structure, however, a dead (useless) space is likely to occur in the layout of the system LSI. If all the IO terminals are provided on one side of the system LSI, the area of the system LSI can be reduced, leading to a reduction in cost of the system LSI. Therefore, it is very desirable that the IO terminals be arranged in a straight line on one side of the LSI circuit. Also, when the bit width is increased, it is more efficient to form one more IO terminal cell in two perpendicular directions, and therefore, the IO terminals are often provided on one side.

In this structure, the LSI circuit mounted on the BGA and the two memory elements may be arranged as follows.

(1) Two LSI substrates are arranged in an L-shape on a corner portion of a BGA substrate on which an LSI circuit is mounted, with the corner being interposed between the two LSI substrates. Balls provided at the corner portion of the BGA substrate are joined to memory IO terminals of the LSI circuit, and the corner balls and the memory elements are joined together.

(2) The IO terminals of an LSI circuit are joined to balls provided on one side of a BGA substrate facing the IO terminal cell, and the two memory elements are arranged along the one side of the BGA substrate and joined to the balls.

The structure of (1) has the following problem. There is an imbalance between the lengths of interconnects to the left and right memory elements on the BGA substrate, and therefore, there is a difference in data transmission time between the left and right memory elements, likely leading to a malfunction.

The structure of (2) has a longer address bus and control signal bus, and therefore, a terminating resistor is often required for high-speed transmission. Therefore, the structure (2) has the following problem. The area of memories on a mounting substrate on which the BGA substrate and the memory devices are mounted is larger than that of the memory arrangement of (1), resulting in an increase in cost of the mounting substrate and a disadvantage to the size reduction of the mounting substrate.

The present disclosure describes implementations of a BGA packaging structure in which signals can be transmitted from all IO terminals having specific functions of a semiconductor integrated circuit element to balls on a BGA substrate, quickly and in substantially the same length of time.

An example semiconductor device includes a semiconductor integrated circuit element, and a substrate on which the semiconductor integrated circuit element is mounted. The semiconductor integrated circuit element is in the shape of a polygonal plate. The substrate is in the shape of a polygonal plate. An interface pin or pins for transmitting and receiving a signal having a predetermined function of the semiconductor integrated circuit element are all formed on an outer periphery of the semiconductor integrated circuit element along one side of the semiconductor integrated circuit element. The one side of the semiconductor integrated circuit element is adjacent to two of sides of the substrate, the two sides being not parallel to the one side. Of electrode terminals provided on the substrate, an electrode terminal or terminals electrically connected to the interface pin or pins for transmitting and receiving a signal having a predetermined function are provided between the one side of the semiconductor integrated circuit element and the two sides of the substrate.

The interface pin or pins for transmitting and receiving a signal having a predetermined function may be a plurality of memory data IO terminals, a plurality of control signal IO terminals, and a plurality of address IO terminals, and may be arranged along the one side of the semiconductor integrated circuit element in the order of the memory data IO terminals, the control signal IO terminals, the address IO terminals, and the memory data IO terminals, or in the order of the memory data IO terminals, the control signal IO terminals, the address IO terminals, the control signal IO terminals, and the memory data IO terminals. With this configuration, even when a plurality of memory elements are used, the lengths of the memory data bus and the address bus can be equalized.

Of the electrode terminals, electrode terminals electrically connected to the address IO terminals may be located at a corner portion formed by the two sides of the substrate, and electrode terminals electrically connected to the memory data IO terminals may be located along the two sides with the corner portion being interposed therebetween. With this configuration, when a plurality of memory elements are provided outside the substrate, the lengths of the memory data bus and the address bus can be equalized.

A line passing through the angle formed by the two sides of the substrate and intersecting at right angles with the one side of the semiconductor integrated circuit element, may pass through a region where the address IO terminals are located.

The semiconductor integrated circuit element may be in the shape of a rectangular plate. With this configuration, when a plurality of memory elements are provided outside the substrate, the lengths of the memory data bus and the address bus can be easily equalized.

An example electronic device of the present disclosure includes the above semiconductor device and two memory elements. The two memory elements are adjacent to the two sides of the substrate, and an interconnect between the address IO terminals and address bus terminals of the two memory elements has a T-branched shape.

DETAILED DESCRIPTION

The term "BGA substrate" as used herein refers to a ball grid array substrate. The term "interface pin" as used herein refers to an input/output (IO) terminal provided in a semiconductor integrated circuit element.

The term "predetermined function" as used herein with respect to a semiconductor integrated circuit element refers to, for example, a function of transmitting and receiving data to and from a peripheral memory element, a function of processing a control signal input from external circuitry, etc.

The term "outer periphery in which interface pins are formed" as used herein with respect to a semiconductor integrated circuit element refers to a portion of the semiconductor integrated circuit element which is provided outside a polygonal central portion of the semiconductor integrated circuit element and in the vicinity of one side of the semiconductor integrated circuit element.

The phrase "located along one side of a semiconductor integrated circuit element in the order of memory data IO terminals, control signal IO terminals, address IO terminals, and memory data IO terminals, or memory data IO terminals, control signal IO terminals, address IO terminals, control signal IO terminals, and memory data IO terminals" means that a plurality of terminals of each type are grouped, the memory data terminals form at least two terminal groups, and these terminal groups are arranged along one side of the semiconductor integrated circuit element in the above order.

The term "corner portion formed by two sides of a BGA substrate" refers to a sector-shaped region which is located in the vicinity of an angle formed by the two sides and has a radius equal to half a distance between the angle and the semiconductor integrated circuit element.

The phrase "two memory elements are adjacent to two sides of a BGA substrate" means that the memory elements are adjacent to and does not need to contact the sides of the BGA substrate.

The term "T-branched interconnect" does not mean that the interconnect has a T-shaped external appearance, but means that the interconnect extending from an address IO terminal is divided into two branches which are connected to two respective memory elements.

Before describing embodiments, results of preliminarily studying related techniques will be described.

Figure 4:
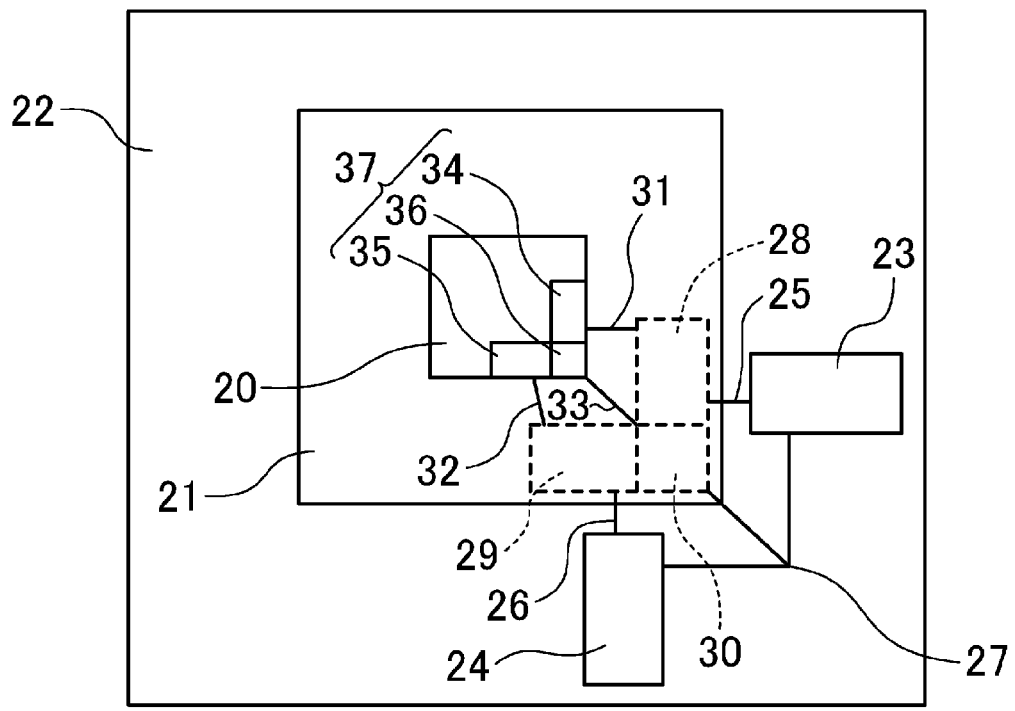
FIG. 4 is a schematic diagram showing a high-speed memory interface arrangement of a system LSI in a related technique and a configuration or structure in which two general-purpose memories for high-speed data transmission are used.

FIG. 4 shows a configuration which has been preliminarily studied and in which two general-purpose memories 23 and 24 for high-speed data transmission are used for a system LSI 20. The system LSI 20 is mounted in a BGA package 21. The BGA package 21 and the memories 23 and 24 are mounted on a printed circuit board (PCB) 22. A memory interface (TO terminals) 37 of the system LSI 20 is arranged in an L-shape around a corner portion of the system LSI 20. A region 36 where a plurality of address bus terminals and control terminals are provided is provided at a center portion of the corner portion. Two regions 34 and 35 where a plurality of data terminals are provided are provided on opposite sides of the address bus terminals and the control terminals.

The system LSI 20 is mounted on the BGA package 21 so that the sides of the system LSI 20 are substantially parallel to the respective corresponding sides of the BGA package 21. A plurality of ball terminals which are provided on a back surface of the BGA package 21 are electrically connected to the address terminals, control terminals 36, and data terminals 34 and 35 of the memory interface (JO terminals) 37 of the system LSI 20 via interconnects. The ball terminals are arranged in an L-shape at the corner portion of the BGA package 21 so that a distance between the interface 37 of the system LSI 20 and the ball terminals of the BGA package 21 which are connected together is minimized. The BGA package 21 and the two memories 23 and 24 are provided on the PCB 22 so that distances between regions 28 and 29 of the data terminal ball groups of the BGA package 21 and data buses 25 and 26 are minimized. An address bus/control signal bus 27 is extended from the corner portion of the BGA package 21 and is then divided into two branches (the address bus/control signal bus 27 is formed into a so-called T-shape) which are connected to the respective corresponding memory elements 23 and 24. By arranging the memory elements 23 and 24 in this manner, the area of the memory elements (including the interconnection region) mounted on the PCB 22 is reduced.

Mounting to the BGA package is performed using either P-BGA, which employs wire bonding, or FCBGA, which employs flip chip.

In the above structure, however, a dead (useless) space is likely to occur in the layout of the system LSI 20. If all the IO terminals are arranged on one side of the system LSI, the area of the system LSI can be reduced, leading to a reduction in cost of the system LSI. Therefore, it is preferable to arrange the IO terminals in a straight line on one side of the LSI. Also, when the bit width is increased, it is more efficient to form one more IO terminal cell in two perpendicular directions, and therefore, the IO terminals are often provided on one side. Therefore, the following two structures are contemplated.

Figure 5:
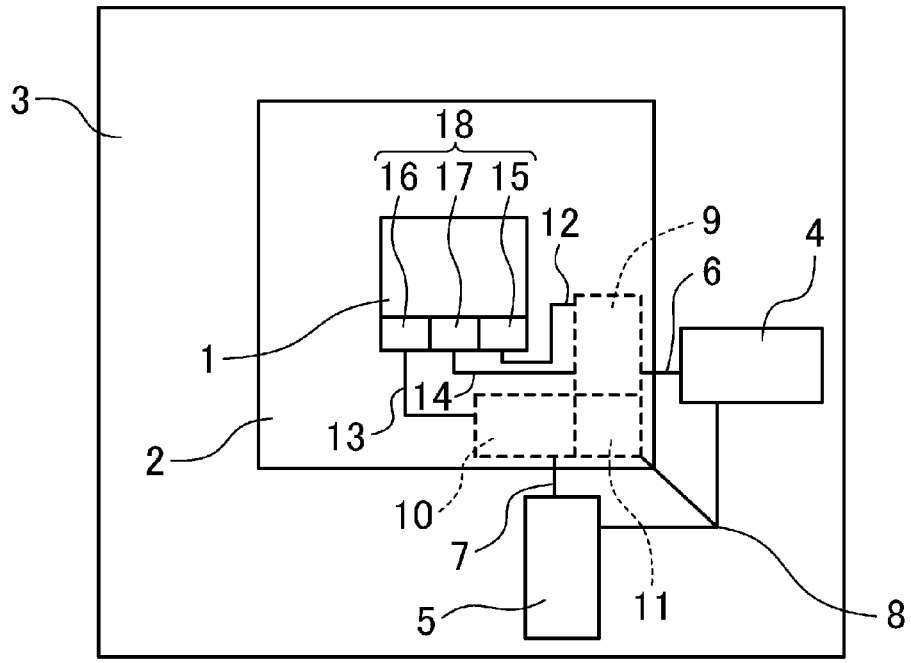
FIG. 5 is a schematic diagram showing an example high-speed data transmission IO terminal structure provided on one side of a system LSI and an example configuration or structure in which two general-purpose memories for high-speed data transmission are used.

In a structure shown in FIG. 5, high-speed data transmission IO terminals 18 are arranged in one side of a system LSI 1 in the order of a data terminal group 15, an address terminal group, a control terminal group (the combination of the address terminal group and the control terminal group is indicated by a reference character 17), and a data terminal group 16, or in the order of the data terminal group 15, the control terminal group/address terminal group 17, and the data terminal group 16. On the other hand, two memory elements 4 and 5 are mounted on a PCB 3 so that a corner of the PCB 3 is interposed between the memory elements 4 and 5. In order to reduce the area of the memory elements mounted on the PCB 3, an address bus/control bus 8 is arranged in a T-branched shape relative to a corner of a BGA substrate 2. In this case, address bus terminal balls 11 are provided on a corner portion of the BGA substrate 2, and data bus terminal balls 9 and 10 are provided on opposite sides of the corner portion of the BGA substrate 2. In such an arrangement, complicated interconnection is required on the BGA substrate 2, and there is an imbalance between the lengths of data buses 12 and 13 to the left and right memories 4 and 5, and therefore, there is an imbalance in data transmission time, likely leading to a malfunction.

Figure 6:
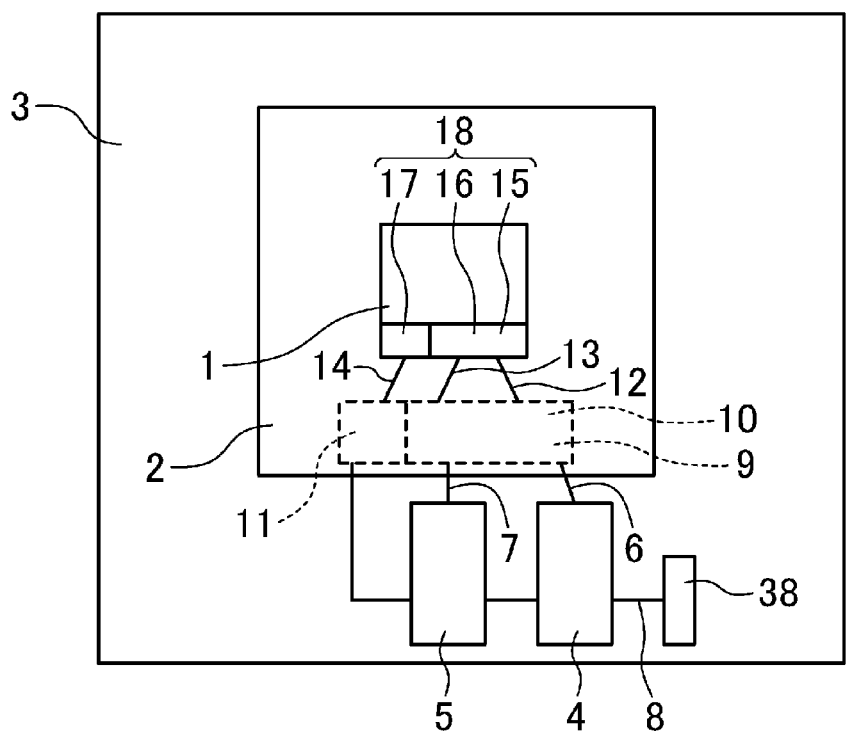
FIG. 6 is a schematic diagram showing another example high-speed data transmission IO terminal structure provided on one side of a system LSI and another example configuration or structure in which two general-purpose memories for high-speed data transmission are used.

In a structure shown in FIG. 6, high-speed data transmission IO terminals 18 are arranged in one side of a system LSI 2 in the order of, for example, an address terminal group/control signal terminal group 17, a data terminal group 16, and another data terminal group 15, and balls are provided on one side of the BGA substrate 2. In this case, two memory elements 4 and 5 may need to be arranged so that address bus terminal balls/control signal terminal balls 11, data bus terminal balls 10, and other data bus terminal balls 9 are arranged in a so-called "fly-by" topology to reduce an interconnection region of data buses 6 and 7 to the extent possible. In this case, an address bus/control signal bus 8 is long, and therefore, a terminating resistor 38 is often required during high-speed transmission. In such a configuration, the area of the memories on the PCB 3 is larger than that of the memory arrangement of FIG. 5, leading to an increase in cost of the PCB 3 and a disadvantage to size reduction.

Based on these and other studies, the present inventors have achieved the present disclosure.

Embodiments of the present disclosure will be described in detail hereinafter with reference to the drawings. In the drawings, components having substantially the same functions are indicated by the same reference characters for the sake of simplicity.

First Embodiment

Figure 1:
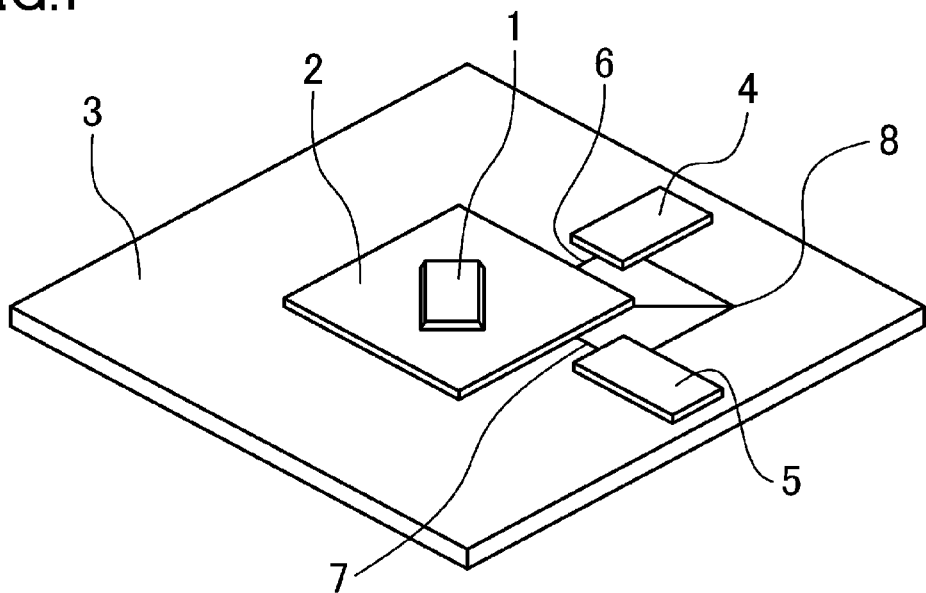
FIG. 1 is a schematic diagram showing how an FCBGA semiconductor device according to an embodiment and two memory elements are mounted on a PCB, as viewed at an angle from above.
Figure 2:
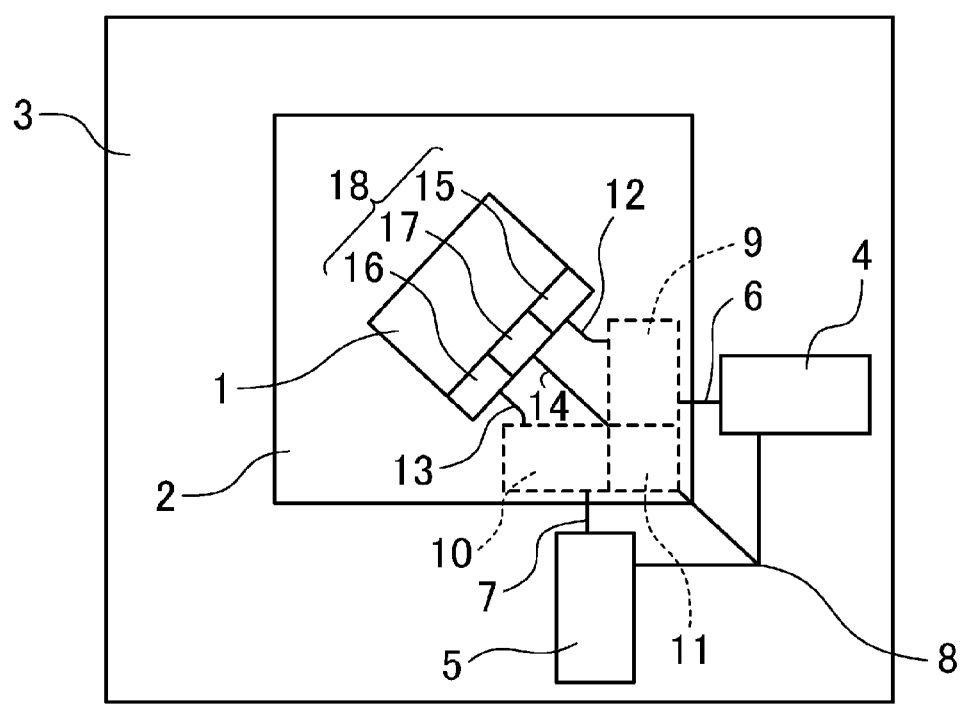
FIG. 2 is a schematic diagram showing an arrangement of IO terminals in a system LSI according to an embodiment, an arrangement of ball terminals provided on a BGA substrate for joining the BGA substrate to a PCB, a positional relationship between the two memory elements on the PCB, and a positional relationship between bus line paths between the IO terminals of the system LSI and the memory elements.

FIG. 1 is a schematic diagram showing how an FCBGA semiconductor device according to a first embodiment and two memory elements 4 and 5 are mounted on a PCB 3, as viewed at an angle from above. FIG. 2 is a schematic diagram showing an arrangement of IO terminals in a system LSI 1 of this embodiment, an arrangement of ball terminals provided on a BGA substrate 2 for joining the BGA substrate 2 to the PCB 3, a positional relationship between the two memory elements 4 and 5 on the PCB 3, and a positional relationship between bus line paths between the IO terminals of the system LSI 1 and the memory elements 4 and 5.

Here, a reference character 6 indicates a first data bus line path connected to the first memory element 4, a reference character 7 indicates a second data bus line path connected to the second memory element 5, a reference character 8 indicates an address bus line path/control signal line path connected to the first and second memory elements 4 and 5, a reference character 9 indicates a first data bus ball group connected to the first memory element 4, a reference character 10 indicates a second data bus ball group connected to the second memory element 5, a reference character 11 indicates an address ball group/control signal ball group connected to the first and second memory elements 4 and 5, a reference character 15 indicates a first data IO terminal group provided on the LSI 1, a reference character 16 indicates a second data IO terminal group provided on the LSI 1, a reference character 17 indicates an address IO terminal group/control signal IO terminal group provided on the LSI 1, a reference character 18 indicates an IOcell in which the first data IO terminal group 15, the address IO terminal group/control signal IO terminal group 17, and the second data IO terminal group 16 are arranged in a line, a reference character 12 indicates a first data bus connecting the first data bus ball group 9 and the first data IO terminal group 15 together, a reference character 13 indicates a second data bus connecting the second data ball group 10 and the second data IO terminal group 16 together, and a reference character 14 indicates an address bus/control signal bus connecting the address IO terminal group/control signal IO terminal group 17 and the address ball group/control signal ball group 11 together.

Figure 7:
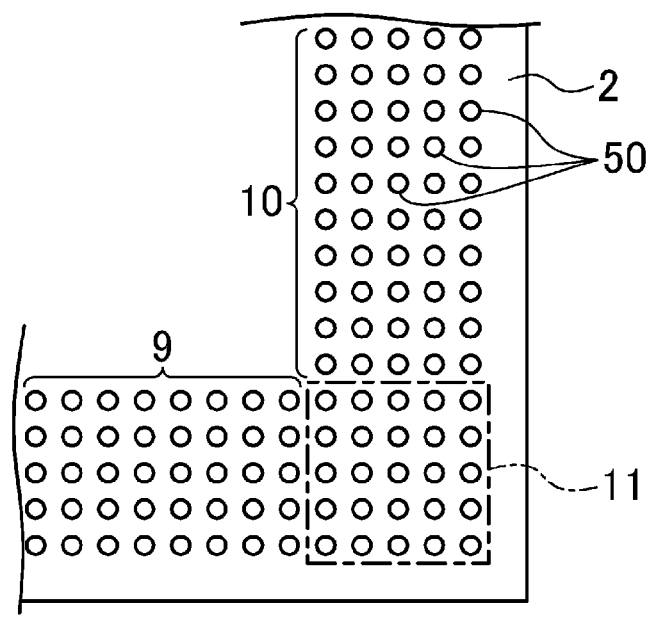
FIG. 7 is a schematic enlarged view of a back surface of a BGA substrate.
Figure 8:
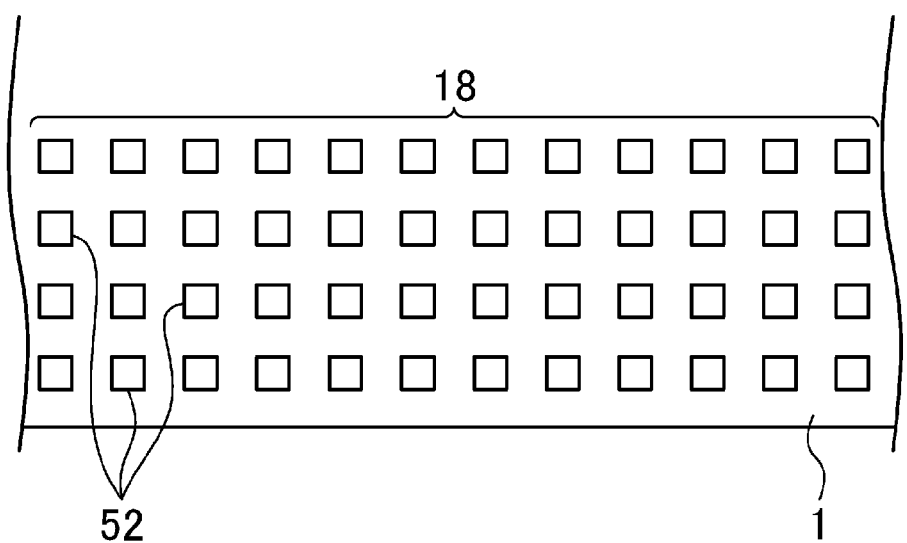
FIG. 8 is a schematic enlarged view of electrode pads (interface pins) formed on a circuit-mounted area of a semiconductor integrated circuit element.

As shown in FIGS. 7 and 8, a large number of hemispherical balls 50, 50, . . . are arranged on a back surface of the BGA substrate 2, and a large number of interface pins 52, 52, . . . are arranged on a circuit-mounted surface of the LSI 1.

In this embodiment, the LSI 1 is in the shape of a rectangular plate, and the BGA substrate 2 is also in the shape of a rectangular plate. The LSI 1 and the BGA substrate 2 are stacked on each other and tilted relative to each other so that corresponding sides thereof are not parallel to each other. The memory IO cell 18 of the system LSI 1 mounted on the BGA package substrate 2 is all arranged on one side of the system LSI 1 in the order of the first data IO terminal group 15, the address IO terminal group/control signal IO terminal group 17, and the second data IO terminal group 16. The system LSI 1 is mounted on the BGA substrate 2 by flip chip so that the length of the address bus/control signal bus 14 is minimized, and the first data bus 12 and the second data bus 13 have substantially the same length.

The first data ball group 9, the second data ball group 10, and the address ball group/control signal ball group 11 are provided in a region surrounded by a side of the LSI 1 on which the IO cell 18 is provided and two sides of the BGA substrate 2 adjacent to the side of the LSI 1. The address ball group/control signal ball group 11 is located at a corner portion of the BGA substrate 2. Therefore, if the LSI 1 is mounted on the BGA substrate 2 as described above, the foot of a line dropped from the corner of the BGA substrate 2 at which the address ball group/control signal ball group 11 is provided to the side of the LSI 1 on which the IO cell 18 is provided, is located at a portion where the address IO terminal group/control signal terminal group 17 is provided.

The arrangement of the IO cell 18 of the LSI 1 and the BGA substrate 2 is determined so that the first data bus 12, the second data bus 13, and the address bus/control signal bus 14 on the BGA substrate 2 are each minimized. By providing the first and second memory elements 4 and 5 on the PCB 3 at positions adjacent to the first data bus ball group 9 and the second data bus ball group 10, respectively, the lengths of the first and second data bus line paths 6 and 7 are minimized, and are equalized as much as possible. The address bus line path/control signal bus line path 8 is divided into two branches (i.e., formed into a T-shape) to have an equal interconnect length to the first and second memory elements 4 and 5. Here, a range within which the data bus line paths, and the branches of the address bus line path/control signal bus line path, have an equal interconnect length means an allowable skew difference of the memory elements 4 and 5.

The first and second data buses 12 and 13 on the FCBGA substrate 2, and the first and second data bus line paths 6 and 7 on the PCB 3, all have the same standardized characteristic impedance of, for example, 50 or 75Ω. A terminating resistor (not shown) may be provided after the first and second data bus line paths 6 and 7, or an on-device termination (ODT) function may be used, when necessary. Similarly, the address bus/control signal bus 14 on the FCBGA substrate 2 and the address bus line path/control signal bus line path 8 on the PCB 3 all have the same standardized characteristic impedance of, for example, 50 or 75Ω. A terminating resistor (not shown) may be provided only at the T-branched portion when necessary. Typically, when a reflection waveform which disturbs the high and low thresholds of a rectangular waveform is not observed, a terminating resistor is not required.

Although, in this embodiment, FCBGA is used, similar advantages can be obtained using P-BGA, which employs wire bonding.

Figure 3:
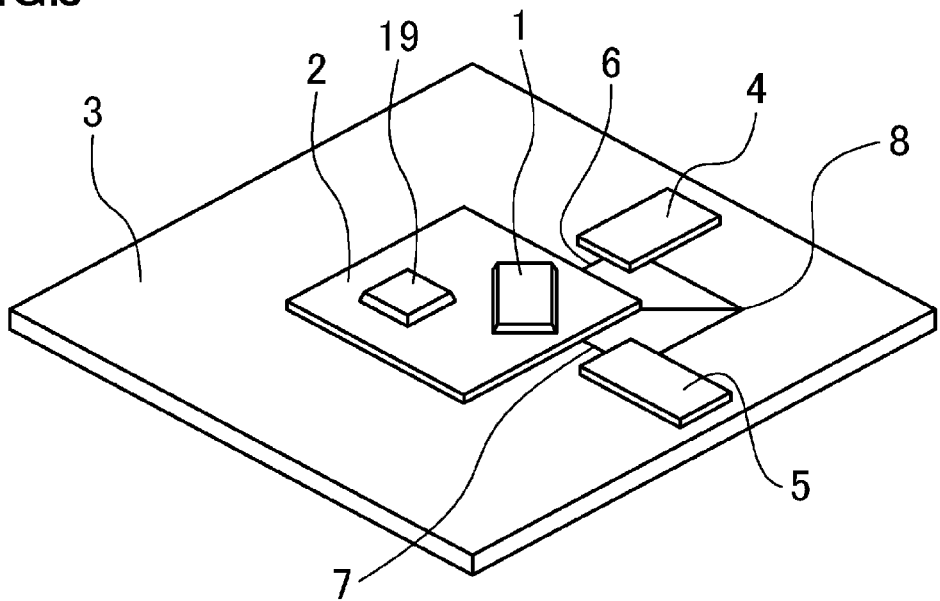
FIG. 3 is a schematic diagram showing a multi-chip module (MCM) or a system-in-a-package (SiP) according to an embodiment on which a plurality of LSI elements are mounted.

As shown in FIG. 3, the present disclosure is also applicable to high-speed transmission memory IO terminals of a multi-chip module (MCM) or a system-in-a-package (SiP), which includes a plurality of LSI elements.

As described above, if a semiconductor device having the configuration of this embodiment is employed, two memories are provided at respective positions each corresponding to a data bus portion, whereby the data bus lengths can be minimized and equalized. The address bus is divided into two branches (i.e., formed into a T-shape), and the address bus of the IO terminal, the ball terminal on the BGA package, and the address bus on the PCB can be arranged in substantially a straight line and connected together using an interconnect having a minimized length. As a result, if a terminating resistor is added to only the T-branched portion of the address bus portion, or even if a terminating resistor is not provided, high-speed data transmission having a transmission rate of about 1.3 Gbps, which is similar to the DDR3 standard, can be achieved. Moreover, the interconnection region of the PCB can be reduced. Also, on the BGA package, interconnects (data buses and address buses) can be straightforwardly designed and the lengths thereof can be minimized, and therefore, can have an arrangement considerably advantageous to high-speed transmission. Therefore, a malfunction of a high-speed transmission signal can be reduced or eliminated, whereby a semiconductor device having stable operation can be obtained, and therefore, an electronic apparatus having stable operation can be obtained. If a terminating resistor or an ODT function is not used, it is possible to remove power consumption of the terminating resistor portion and the ODT portion, whereby power consumption can be reduced.

Note that Japanese Patent Publication No. H11-186326 describes that a system LSI element is provided in and tilted relative to a package so that corresponding sides thereof are not parallel to each other. However, this is directed to a technique of reducing warpage of a large-size BGA package itself when the package is mounted on a PCB.

Japanese Patent Publication No. H11-186326 does not describe the arrangement of IO terminals which is described herein. It is not considered that Japanese Patent Publication No. H11-186326 can provide high-speed data transmission without a malfunction.

Second Embodiment

Figure 9:
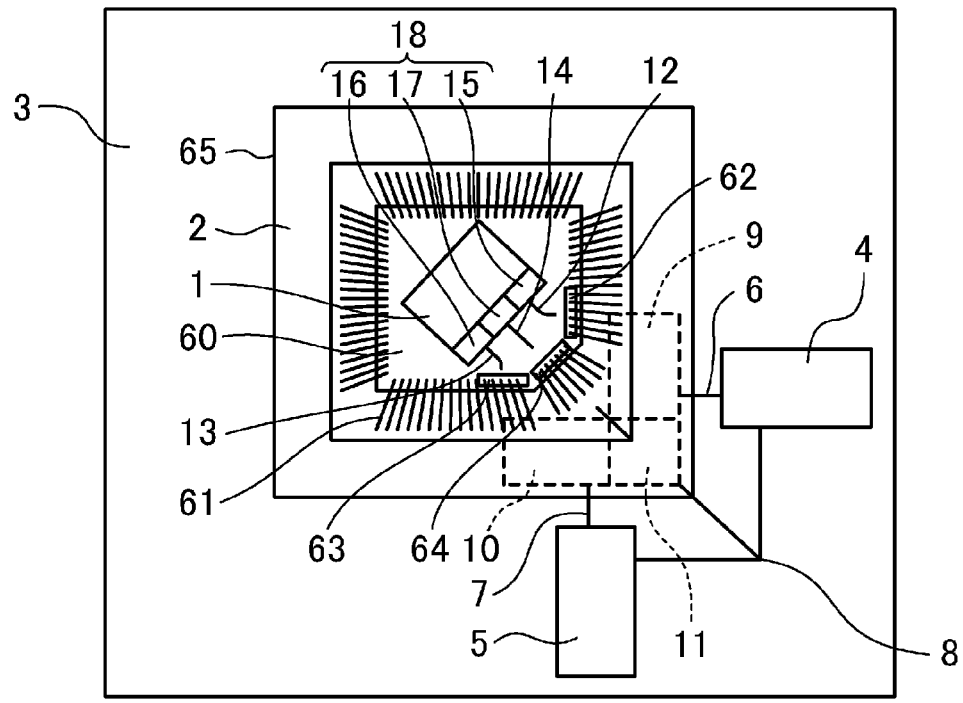
FIG. 9 is a schematic plan view of a semiconductor device according to a second embodiment.

FIG. 9 is a plan view schematically showing a semiconductor device according to a second embodiment. This embodiment is different from the first embodiment in that an intermediate interposer 60 is provided between the system LSI element 1 and the BGA substrate 2. The difference from the first embodiment will be mainly described hereinafter.

In this embodiment, a reference character 61 indicates wires connecting the intermediate interposer 60 and the BGA substrate 2 together, a reference character 62 indicates a first data bus wire pad group provided on the intermediate interposer 60, a reference character 63 indicates a second data bus wire pad group provided on the intermediate interposer 60, a reference character 64 indicates an address bus line path/control signal line path wire pad group provided on the intermediate interposer 60, a reference character 12 indicates a first data bus connecting the first data bus wire pad group 62 and the first data IO terminal group 15 together, a reference character 13 indicates a second data bus connecting the second data bus wire group 63 and the second data IO terminal group 16 together, and a reference character 14 indicates an address bus/control signal bus connecting the address IO terminal group/control signal IO terminal group 17 and the address bus wire pad group/control signal wire pad group 64.

The system LSI 1 is mounted on the intermediate interposer 60 by flip chip. At a portion of the intermediate interposer 60 on which the address bus line path/control signal line path wire pad group 64 is provided, a corner of the rectangle is cut away so that the portion is substantially parallel to the IO cell group 18 of the system LSI 1. The intermediate interposer 60 and the BGA substrate 2 are electrically connected via the wires 61. A signal group interconnect 8 extending from the address IO terminal group/control signal IO terminal group 17 is extended in substantially a straight line and connected from the address bus line path/control signal line path wire pad group 64 provided on the intermediate interposer 60 via the conductive wire 61 to the address ball group/control signal ball group 11 connected to the first and second memory elements 4 and 5. The intermediate interposer may be a so-called silicon interposer made of silicon. The system LSI 1, the intermediate interposer 60, and the wires 61 on the BGA substrate 2 are all enclosed and covered with an encapsulation resin 65.

Third Embodiment

Figure 10:
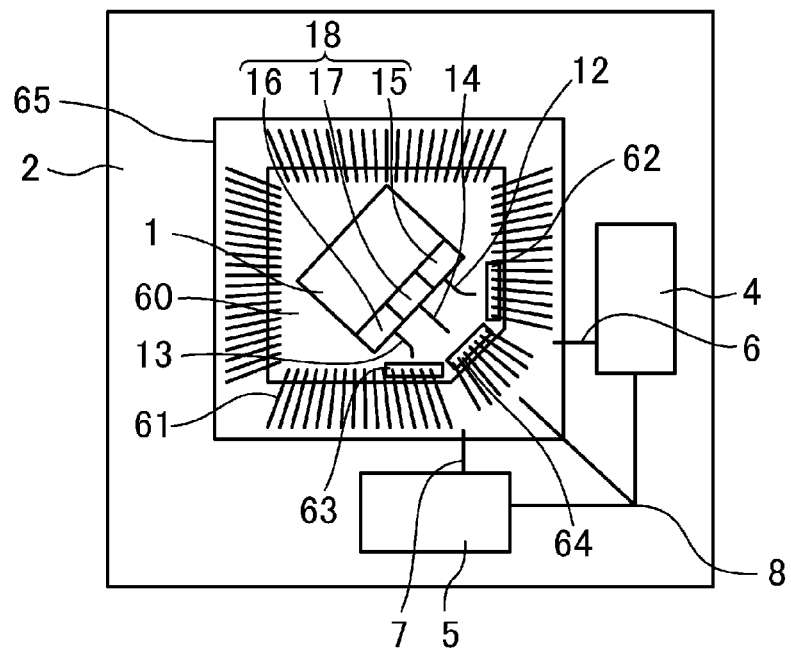
FIG. 10 is a schematic plan view of a semiconductor device according to a third embodiment.

In the second embodiment, the memory elements 4 and 5 are provided on the PCB substrate 3 and are connected via the BGA substrate 2. Alternatively, a system-in-package (SiP) or package-on-package (POP) structure in which the memory elements 4 and 5 are provided on the BGA substrate 2 can be formed. FIG. 10 is a schematic plan view of a semiconductor device according to a third embodiment. In the semiconductor device of this embodiment, the ball groups 9, 10, and 11 of the second embodiment of FIG. 9 are not provided, and the memory elements 4 and 5 are directly provided on the BGA substrate 2, and the signal line groups 12, 13, and 14, the wire pad groups 62, 63, and 64, and the data bus groups 6, 7, and 8 are connected together via the wires 61. Thus, an SiP or POP structure in which the memory elements 4 and 5 are provided on the BGA substrate 2 can be formed.

Other Embodiments

The above embodiments are intended only for illustrative purposes and are not intended to limit the present disclosure. For example, the shapes of the LSI and the BGA substrate are not limited to a rectangular plate and may be a polygonal plate, such as a pentagonal plate, a hexagonal plate, etc. One address IO terminal group and one control signal IO terminal group may be provided on the LSI. Alternatively, one address IO terminal group and two control signal IO terminal groups may be provided on the LSI with one control signal IO terminal group being provided on one of opposite sides of the address IO terminal group.

In the semiconductor devices of the embodiments, all interface pins for transmitting and receiving a signal having a predetermined function are formed on an outer periphery at one side of a semiconductor integrated circuit element. The side is adjacent to two sides of the substrate which are not parallel to that side. In a region surrounded by the three sides, electrode terminals for electrically connecting to the interface pins for transmitting and receiving a signal having a predetermined function are provided. Therefore, the length of a bus between the semiconductor integrated circuit element and another semiconductor element provided outside the substrate can be reduced.

In the semiconductor devices of the embodiments, smooth data transmission can be provided between an LSI element on a BGA package and a memory element. Therefore, the present disclosure is useful for a semiconductor device (e.g., a BGA, an MCM, and an SiP) including a single or a plurality of LSIs, etc.

What is claimed is:

1. A semiconductor device comprising:
   a semiconductor integrated circuit element; and
   a substrate on which the semiconductor integrated circuit element is mounted,
   wherein
   the semiconductor integrated circuit element is in the shape of a polygonal plate,
   the substrate is in the shape of a polygonal plate,
   an interface pin or pins for transmitting and receiving a signal having a predetermined function of the semiconductor integrated circuit element are formed on an outer periphery of the semiconductor integrated circuit element along one side of the semiconductor integrated circuit element,
   the one side of the semiconductor integrated circuit element is adjacent to two of sides of the substrate, the two sides being not parallel to the one side, and
   of electrode terminals provided on the substrate, an electrode terminal or terminals electrically connected to the interface pin or pins for transmitting and receiving a signal having a predetermined function are provided between the one side of the semiconductor integrated circuit element and the two sides of the substrate.

2. The semiconductor device of claim 1, wherein
   the interface pin or pins for transmitting and receiving a signal having a predetermined function are a plurality of memory data IO terminals, a plurality of control signal IO terminals, and a plurality of address IO terminals, and are arranged along the one side of the semiconductor integrated circuit element in the order of the memory data IO terminals, the control signal IO terminals, the address IO terminals, and the memory data IO terminals, or in the order of the memory data IO terminals, the control signal IO terminals, the address IO terminals, the control signal IO terminals, and the memory data IO terminals.

3. The semiconductor device of claim 2, wherein
   of the electrode terminals, electrode terminals electrically connected to the address IO terminals are located at a corner portion formed by the two sides of the substrate, and electrode terminals electrically connected to the memory data IO terminals are located along the two sides with the corner portion being interposed therebetween.

4. The semiconductor device of claim 2, wherein
a line passing through the angle formed by the two sides of the substrate and intersecting at right angles with the one side of the semiconductor integrated circuit element, passes through a region where the address IO terminals are located.

5. The semiconductor device of claim 1, wherein
the semiconductor integrated circuit element is in the shape of a rectangular plate.

6. An electronic device comprising:
the semiconductor device of any one of claims 2-5; and
two memory elements,
wherein
the two memory elements are adjacent to the two sides of the substrate, and
an interconnect between the address IO terminals and address bus terminals of the two memory elements has a T-branched shape.

\* \* \* \* \*